US009035930B2

(12) United States Patent
Lee et al.

(10) Patent No.: US 9,035,930 B2
(45) Date of Patent: May 19, 2015

(54) DISPLAY DEVICE AND DRIVING METHOD THEREOF

(75) Inventors: Seung Kyu Lee, Yongin (KR); Jinwoo Park, Yongin (KR); Dong-Hoon Lee, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 706 days.

(21) Appl. No.: 13/067,983

(22) Filed: Jul. 13, 2011

(65) Prior Publication Data

US 2012/0139886 A1    Jun. 7, 2012

(30) Foreign Application Priority Data

Dec. 3, 2010  (KR) ........................ 10-2010-0122897

(51) Int. Cl.
G06F 3/038       (2013.01)
G09G 3/36        (2006.01)
G11C 19/18       (2006.01)
G11C 19/28       (2006.01)

(52) U.S. Cl.
CPC ............ G09G 3/3677 (2013.01); G09G 3/3614 (2013.01); G11C 19/184 (2013.01); G11C 19/28 (2013.01); G09G 2300/0434 (2013.01); G09G 2300/0876 (2013.01)

(58) Field of Classification Search
CPC .................................................... G06F 3/3038
USPC ........................................................ 345/100
See application file for complete search history.

(56) References Cited

U.S. PATENT DOCUMENTS

| 7,468,720 | B2 | 12/2008 | Kim | |
|---|---|---|---|---|
| 2005/0264513 | A1* | 12/2005 | Lim | ............................. 345/100 |
| 2008/0094531 | A1 | 4/2008 | Lee et al. | |
| 2010/0110046 | A1* | 5/2010 | Chen et al. | .................... 345/204 |
| 2010/0149155 | A1* | 6/2010 | Maki et al. | .................... 345/211 |

FOREIGN PATENT DOCUMENTS

| EP | 1918905 A1 | 5/2008 |
|---|---|---|
| JP | 2008-107831 | 5/2008 |
| KR | 10-2004-0073703 A | 8/2004 |
| KR | 10-2005-0064304 A | 6/2005 |
| KR | 10-2008-0036912 A | 4/2008 |

* cited by examiner

*Primary Examiner* — Gregory J Tryder
*Assistant Examiner* — Sepideh Ghafari
(74) *Attorney, Agent, or Firm* — Lee & Morse, P.C.

(57) ABSTRACT

A display device may have a plurality of pixels of a first group connected to a plurality of first gate lines and first common voltage lines and a plurality of pixels of a second group connected to a plurality of second gate lines and second common voltage lines. The display device drives the first common voltage lines and the second common voltage lines in synchronization with a first clock signal; and drives the plurality of first gate lines and the plurality of second gate lines in synchronization with a second clock signal. I-th first and second common voltage lines (i is a positive integer) are driven to one of a first common voltage and a common reference voltage, and (i+1)-th first and second common voltage lines are driven to one of a second common voltage and the common reference voltage.

20 Claims, 11 Drawing Sheets

DISPLAY DEVICE AND DRIVING METHOD THEREOF

CROSS-REFERENCE TO RELATED APPLICATIONS

This U.S. non-provisional patent application claims priority under 35 U.S.C. §119 of Korean Patent Application No. 10-2010-0122897, filed on Dec. 3, 2010, the entire contents of which are hereby incorporated by reference.

BACKGROUND

1. Field

Embodiments relate to a display device and a driving method thereof.

2. Description of the Related Art

Liquid Crystal Displays (LCDs) include two display substrates which include a pixel electrode and a common electrode, and a liquid crystal layer having dielectric anisotropy therebetween. Pixel electrodes are arranged in a matrix type, are respectively connected to switching devices, i.e., Thin Film Transistors (TFTs), and sequentially receive data voltages row by row. Common electrodes are formed on one of the two display substrates, and receive a common voltage. The pixel electrode, the common electrode and the liquid crystal layer therebetween configure a liquid crystal capacitor in a circuit. The liquid crystal capacitor configures a pixel together with a switching device connected to it.

Such LCDs generate an electric field for driving of the liquid crystal layer by applying different voltages to the common electrode and the pixel electrode, and control the light transmittance of the liquid crystal layer by controlling the intensity of the electric field. Thus, a desired image is realized. In this case, the LCDs invert the polarity of a data voltage with respect to a common voltage per frame, row or pixel, for preventing the deterioration of an image that occurs when one-directional electric field is repeatedly applied to the liquid crystal layer for a relative long time.

SUMMARY

Embodiments may be directed to a display device, and a driving method thereof.

Embodiments may be directed to a display device, including: a plurality of pixels of a first group and a plurality of pixels of a second group, wherein the pixels of the first group are connected to a plurality of first gate lines and first common voltage lines, and the plurality of pixels of the second group are connected to a plurality of second gate lines and second common voltage lines; a first gate driver driving the plurality of first gate lines, and outputting a plurality of first line enable signals which respectively correspond to the first gate lines of the plurality of first gate lines; a first common voltage driver driving the first common voltage lines in response to first enable signals of the plurality of first line enable signals; a second gate driver driving the plurality of second gate lines, and outputting a plurality of second line enable signals which respectively correspond to the second gate lines of the plurality of second gate lines; and a second common voltage driver driving the second common voltage lines in response to the plurality of second line enable signals, wherein inversion driving of the first common voltage lines is performed by the first common voltage driver per frame, inversion driving of the second common voltage lines is performed by the second common voltage driver per frame, and inversion driving of the first common voltage lines and inversion driving of second common voltage lines are performed, respectively, prior to inversion driving via corresponding first and second gate lines of the plurality of first and second gate lines.

In some embodiments, the first gate driver may include a plurality of stages driving the corresponding first gate lines of the plurality of first gate lines, respectively, and outputting a first line enable signal of the plurality of first line enable signals.

In other embodiments, each stage of the plurality of stages may include: a latch circuit latching a previous first line enable signal from a previous stage to output a first line enable signal, in response to a first clock signal; and an output circuit driving a first gate line according to a first line enable signal, in response to a second clock signal.

In still other embodiments, the latch circuit may include: a clock generator receiving the first clock signal to generate a first and a second sub clock signal; a first switching device including an input terminal for receiving the previous first line enable signal and an output terminal, and operating in response to the first clock signal and the first sub clock signal; a NOR gate receiving a signal of the output terminal of the first switching device and a reset signal to output the first line enable signal; and a second switching device connected between the first line enable signal and the output terminal of the first switching device, and operating in response to the first and the second sub clock signal.

In even other embodiments, the output circuit may include: a logic circuit receiving the second clock signal and the first line enable signal; and a plurality of inverters serially and sequentially connected between an output terminal of the logic circuit and a gate line of the plurality of first gate lines.

In yet other embodiments, each common voltage driver of a plurality of common voltage drivers for the first group may drive a common voltage line to one of a first common voltage and a common reference voltage in response to the first line enable signal.

In further embodiments, each common voltage driver of the common voltage drivers for the first group may include: a first inverter including an input terminal for receiving the first line enable signal of a corresponding stage, and an output terminal; a second inverter including an input terminal connected to the output terminal of the first inverter, and an output terminal; a first transistor connected between the first common voltage and the first common voltage line, and including a gate connected to the output terminal of the first inverter; a second transistor connected between the first common voltage and the first common voltage line, and including a gate connected to the output terminal of the second inverter; a third transistor connected between the common reference voltage and the first common voltage line, and including a gate connected to the output terminal of the first inverter; and a fourth transistor connected between the common reference voltage and the first common voltage line, and including a gate connected to the output terminal of the second inverter.

In still further embodiments, each common voltage driver of a plurality of common voltage drivers for the second group may drive a second common voltage line of the second common voltage lines to one of a second common voltage and the common reference voltage in response to the first line enable signal.

In even further embodiments, the first common voltages and the second common voltages may have complementary voltage levels, and inverted per frame.

In yet further embodiments, an i-th first common voltage line (where i is a positive integer) may be driven to the first common voltage, an (i+1)-th first common voltage line may be driven to the second common voltage, and an interval in which the i-th first common voltage line is driven to the first common voltage may partially overlap with an interval in which the (i+1)-th first common voltage line is driven to the second common voltage.

In yet further embodiments, each stage of the plurality of stages may further output the plurality of second line enable signals corresponding to respective first gate lines of the plurality of first gate lines.

In much further embodiments, each stage of the plurality of stages may include: a first transistor connected between a gate line corresponding to a previous stage and a first node, and including a gate controlled by a first driving signal; a second transistor connected between a gate line corresponding to a next stage and the first node, and including a gate controlled by a second driving signal; a third transistor connected between the first node and a third node, and including a gate controlled by a first clock signal; a fourth transistor connected between a first bias voltage and a second node, and including a gate connected to the first node; a fifth transistor and a sixth transistor, serially and sequentially connected between the first bias voltage and the third node, and including a gate connected to the second node; a first capacitor connected between the first bias voltage and the second node; a seventh transistor connected between a second bias voltage and the second node, and including a gate controlled by an initialization signal; an eighth transistor connected between the first bias voltage and a corresponding gate line, and including a gate connected to the second node; a second capacitor connected between the third node and the corresponding gate line; and a ninth transistor connected between a second clock signal and the corresponding gate line, and including a gate connected to the third node.

In still much further embodiments, each common voltage driver of a plurality of common voltage drivers for the second group may include: a tenth transistor connected between a common reference voltage and a corresponding first common voltage line, and including a gate connected to the second node; and an eleventh transistor connected between a first common voltage and the corresponding first common voltage line, and including a gate connected to the third node.

In other embodiments, a driving method of a display device, which includes a plurality of pixels of a first group connected to a plurality of first gate lines and first common voltage lines and a plurality of pixels of a second group connected to a plurality of second gate lines and second common voltage lines, includes: driving the first common voltage lines and the second common voltage lines in synchronization with a first clock signal; and driving the plurality of first gate lines and the plurality of second gate lines in synchronization with a second clock signal, wherein: i-th first common voltage lines and i-th second common voltage lines (where i is a positive integer) are driven to one of a first common voltage and a common reference voltage, (i+1)-th first common voltage lines and (i+1)-th second common voltage lines is driven to one of a second common voltage and the common reference voltage, and first common voltages and second common voltages have complementary voltage levels, and are inverted per frame.

In some embodiments, an interval in which an ith first common voltage line is driven to the first common voltage may partially overlap with an interval in which an (i+1)-th first common voltage line is driven to the second common voltage.

In still other embodiments, a driving method of a display device, which includes a plurality of pixels of a first group is connected to a plurality of first gate lines and first common voltage lines and a plurality of pixels of a second group are connected to a plurality of second gate lines and second common voltage lines, a plurality of stages respectively corresponding to first gate lines of the plurality of first gate lines and second gate lines of the plurality of second gate lines, and a plurality of common voltage driving units respectively corresponding to the first common voltage lines and the second common voltage lines, includes: outputting, by each stage of the plurality of stages, a line enable signal in response to a previous line enable signal from a previous stage; driving, by each common voltage driving unit of the plurality of common voltage driving units, a corresponding common voltage line in response to the line enable signal; and driving, by each stage of the plurality of stages, a corresponding gate line in response to the line enable signal and a second clock signal, wherein the first common voltage lines and the second common voltage lines are inverted per frame.

In some embodiments, i-th first common voltage lines and i-th second common voltage lines (where i is a positive integer) may be driven to one of a first common voltage and a common reference voltage, and (i+1)-th first common voltage lines and (i+1)-th second common voltage lines may be driven to one of a second common voltage and the common reference voltage.

In other embodiments, when the line enable signal is activated to a first level, i-th first common voltage lines and i-th second common voltage lines may be driven to the first common voltage, and (i+1)-th first common voltage lines and the (i+1)-th second common voltage lines may be driven to the second common voltage.

In still other embodiments, when the line enable signal is deactivated to a second level, the i-th first common voltage lines and the i-th second common voltage lines may be driven to the common reference voltage, and the (i+1)-th first common voltage lines and the (i+1)-th second common voltage lines may be driven to the common reference voltage.

In even other embodiments, the first common voltages and the second common voltages may have complementary voltage levels, and may be inverted per frame.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Korean Patent Application No. 10-2010-0122897, filed on Dec. 3, 2010, in the Korean Intellectual Property Office, and entitled: "Display Device and Driving Method Thereof," is incorporated by reference herein in its entirety.

Example embodiments will now be described more fully hereinafter with reference to the accompanying drawings; however, they may be embodied in different forms and should not be construed as limited to the embodiments set forth herein.

Figure 1:
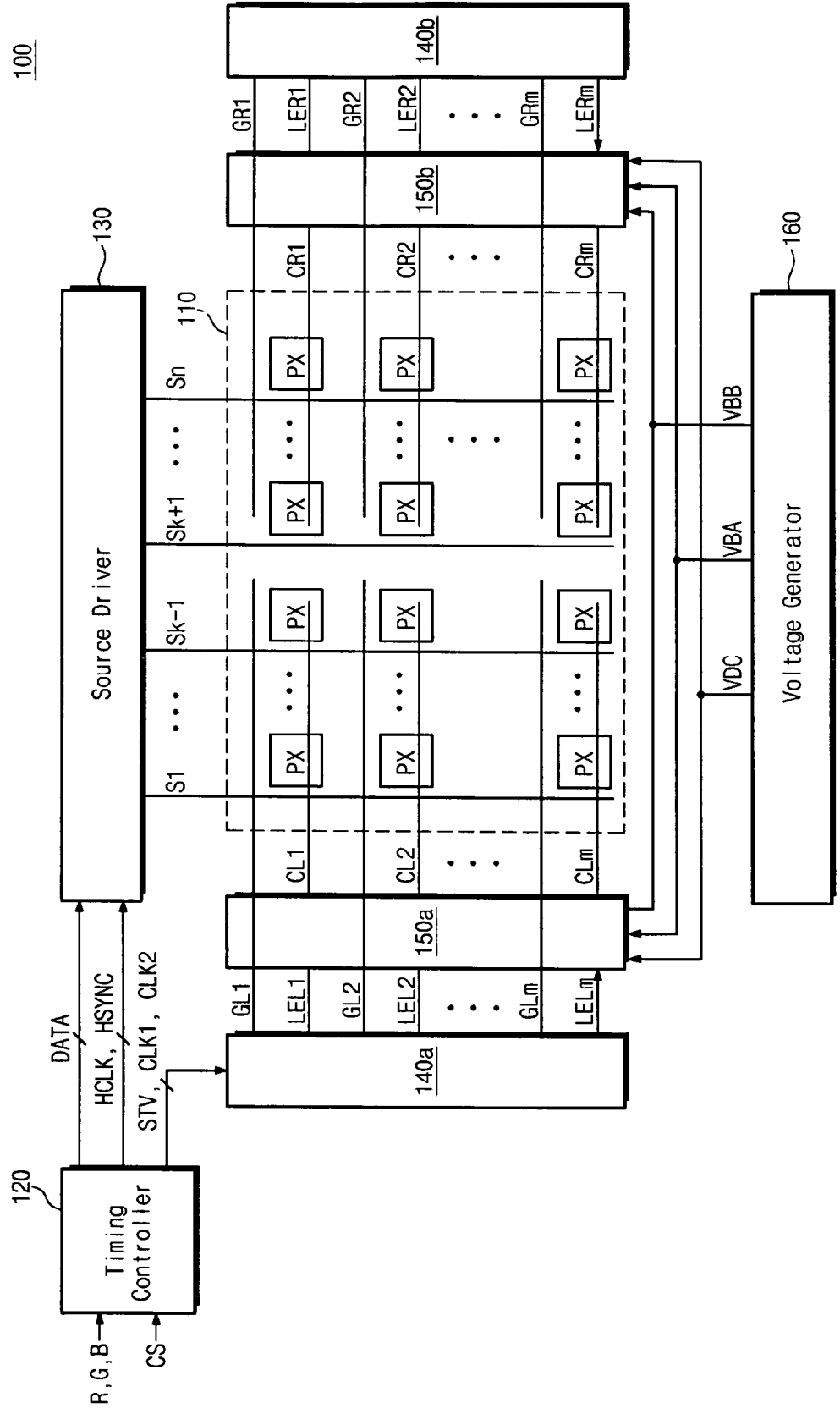
FIG. 1 illustrates a block diagram illustrating a liquid crystal display according to an embodiment.
Figure 2:
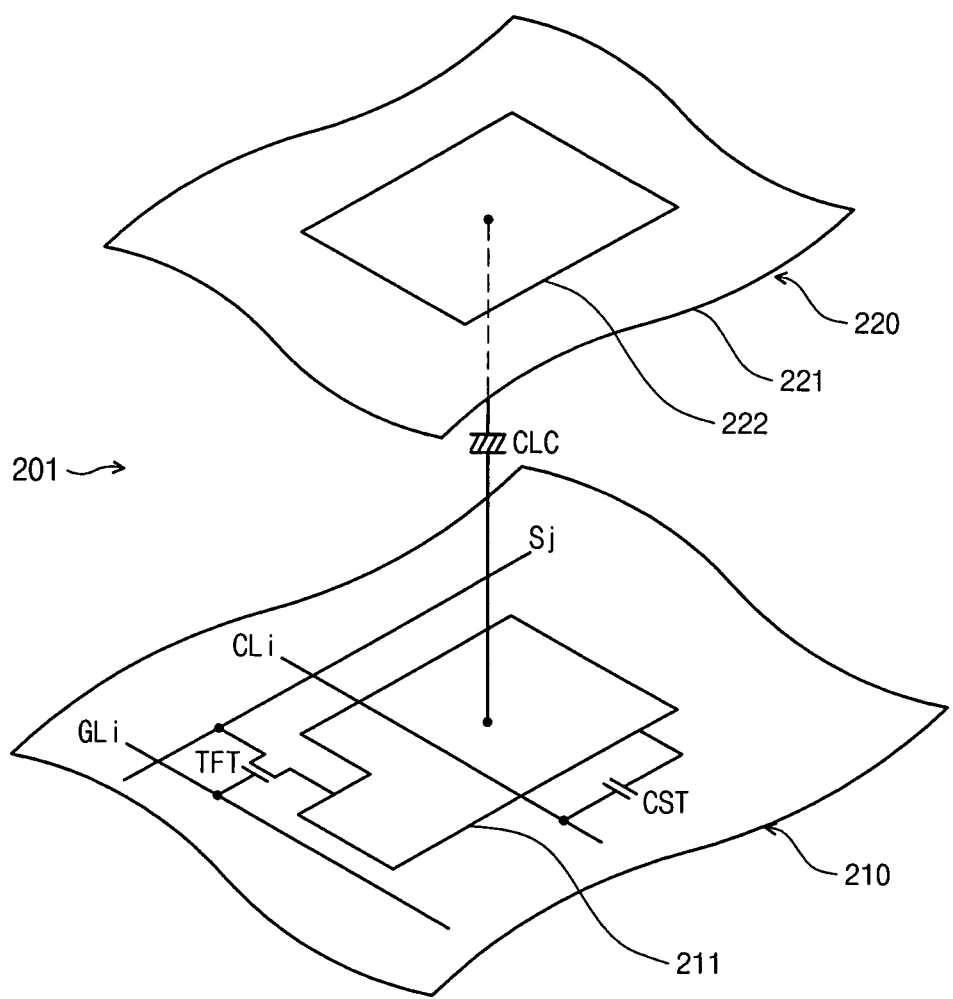
FIG. 2 illustrates an equivalent circuit diagram of a pixel in a liquid crystal display according to an embodiment.

FIG. 1 is a block diagram illustrating a liquid crystal display according to an embodiment. FIG. 2 is an equivalent circuit diagram of a pixel in a liquid crystal display according to an embodiment.

Referring to FIG. 1, a liquid crystal display 100 includes a liquid crystal panel 110, a timing controller 120, a source driver 130, first and second gate drivers 140a and 140b, first and second common line drivers 150a and 150b, and a voltage generator 160.

The liquid crystal panel 110 includes a plurality of first gate lines GL1 to GLm, a plurality of second gate lines GR1 to GRm, a plurality of source lines S1 to Sn that perpendicularly intersect the gate lines GL1 to GLm and GR1 to GRm, a plurality of first common voltage lines CL1 to CLm, a plurality of second common voltage lines CR1 to CRm, and a plurality of pixels PX respectively formed in intersection points between the source lines S1 to Sn and the first and second gate lines GL1 to GLm and GR1 to GRm.

In the structure of FIG. 2, a liquid crystal display substrate assembly 101 includes lower and upper display substrates 210 and 220 that face each other, and a liquid crystal layer 201 disposed therebetween. The signal lines GL1 to GLm, GR1 to GRm, S1 to Sn, CL1 to CLm and CR1 to CRm are formed on the lower display substrate 210.

Each of the pixels PX includes a thin film transistor TFT which has a gate electrode connected to the first gate line GLi and a source electrode connected to the source line Sj, a liquid crystal capacitor CLC, and a storage capacitor CST, wherein one end of the liquid crystal capacitor CLC and one end of the storage capacitor CST are connected to a drain electrode of the thin film transistor TFT in common. The liquid crystal capacitor CLC has two terminals, i.e., a pixel electrode 211 of the lower display substrate 210 and a common electrode 221 of the upper display substrate 220. The liquid crystal layer 201 between the pixel electrode 211 and the common electrode 221 serves as a dielectric. The pixel electrode 211 is connected to the thin film transistor TFT, and the common electrode 221 is formed on the upper display substrate 220 to receive a common voltage VCOM. Unlike in FIG. 2, the common electrode 221 may be formed on the lower substrate 100.

The pixel electrode 211 and the first common voltage line CLi overlap an insulator. Thus, the storage capacitor CST performing the auxiliary function of the liquid crystal capacitor CLC is formed.

In such a pixel structure, the first gate lines GL1 to GLm are sequentially selected by the first gate driver 140a, and the second gate lines GR1 to GRm are sequentially selected by the second gate driver 140b. When a gate-on voltage having a pulse type is applied to the selected gate line, the thin film transistors of pixels connected to the selected gate line are turned on. Thereafter, the source driver 130 applies a voltage including pixel information through the corresponding source lines of the source lines S1 to Sn. The voltage is applied to a corresponding liquid crystal capacitor and a corresponding storage capacitor through the thin film transistor of a corresponding pixel to drive the capacitors. Thus, a display operation is performed.

To display colors, each pixel PX uniquely displays one of primary colors (i.e., space division) or alternately displays the primary colors with time (i.e., time division). Thus, a desired color is displayed by the space and time sum of the primary colors. The primary colors may include, e.g., red, green and blue. As an example of the space division, FIG. 2 illustrates that the each pixel PX includes a color filter 222 having one of the primary colors in the region of the upper display substrate 220 corresponding to the pixel electrode 211. Unlike in FIG. 2, the color filter 222 may be formed on or under the pixel electrode 211 of the lower display substrate 210.

Referring to FIG. 1, the timing controller 120 receives control signals CS and image data signals RGB from an external graphic source. The timing controller 120 outputs control signals (for example, a horizontal sync signal HSYNC, a horizontal clock signal HCLK, a vertical start signal STV, and clock signals CLK1 and CLK2) necessary for driving of the source driver 130 and driving of the first and second gate drivers 140a and 140b, on the basis of the received control signals CS.

The source driver 130 receives an image data signal DATA, the horizontal sync signal HSYNC and the horizontal clock signal HCLK from the timing controller 120 to generate a plurality of source driving signals S1 to Sm for driving the source lines of the liquid crystal panel 110.

The voltage generator 160 generates a common reference voltage VDC, a first common voltage VBA and a second common voltage VBB necessary for driving the first and second common voltage drivers 150a and 150b. The voltage generator 160 may further generate various voltages necessary for the operation of the display device 100, in addition to the voltages necessary for driving of the first and second common voltage drivers 150a and 150b.

The first gate driver 140a outputs gate driving signals for sequentially scanning the first gate lines GL1 to GLm of the liquid crystal panel 110 and first line enable signals LEL1 to LELm necessary for the operation of the first common voltage driver 150a, according to the vertical start signal STV and the clock signals CLK1 and CLK2 that are provided from the timing controller 120. The second gate driver 140b outputs gate driving signals for sequentially scanning the second gate lines GR1 to GRm of the liquid crystal panel 110 and second line enable signals LER1 to LERm necessary for the operation of the second common voltage driver 150b, according to the vertical start signal STV and the clock signals CLK1 and CLK2 that are provided from the timing controller 120. Herein, scanning denotes that pixels connected to a gate line receiving a gate-on voltage are put in a state where data may be written, by sequentially applying the gate-on voltage to the gate lines.

In the case of a liquid crystal display driven in a Plane to Line Switching (PLS) scheme, as illustrated in FIG. 1, since the first gate driver 140a and the first common voltage driver 150a are disposed in the left of the liquid crystal panel 110, and the second gate driver 140b and the second common voltage driver 150b are disposed in the right of the liquid crystal panel 110, a circuit area increases. Thus, a black matrix enlarges. For solving these limitations, the liquid crystal display 100 according to an embodiment minimizes the circuit configurations of the first and second common voltage drivers 150a and 150b, thereby minimizing the size of the black matrix.

Figure 3:
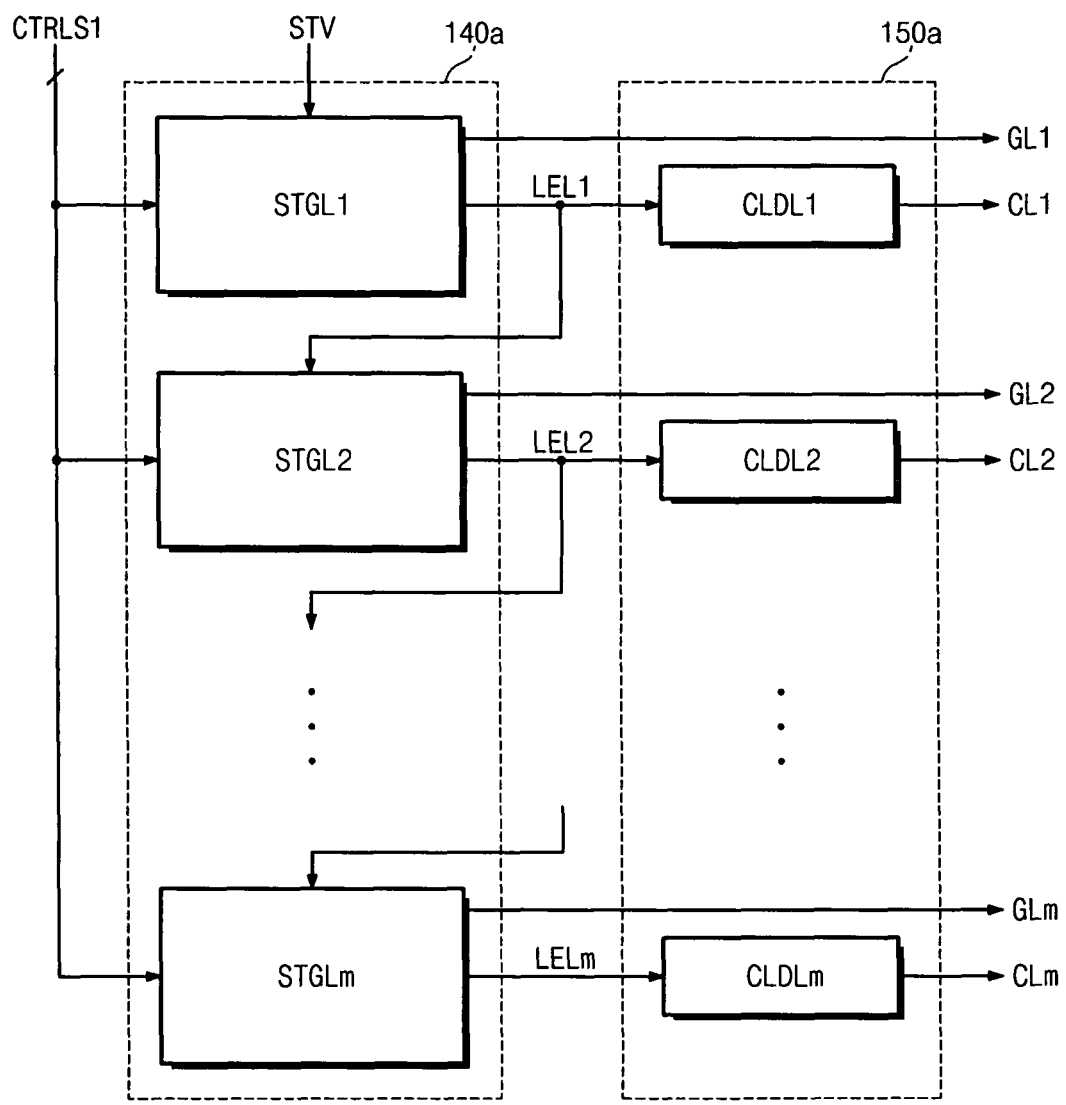
FIG. 3 illustrates a block diagram illustrating detail configurations of the gate driver and common voltage driver of FIG. 2.

FIG. 3 is a block diagram illustrating configurations of the gate driver and common voltage driver of FIG. 2. FIG. 3 illustrates only the first gate driver 140a and first common voltage driver 150a for left pixels. However, the second gate driver 140b for right pixels has the same configuration as that of the first gate driver 140a and operates similarly to the first gate driver 140a. The second common voltage driver 150b for right pixels has the same configuration as that of the first common voltage driver 150a and operates similarly to the first common voltage driver 150a.

Referring to FIG. 3, the gate driver 140a includes a plurality of stages STGL1 to STGLm, and the first common voltage driver 150a includes a plurality of common voltage driving units CLDL1 to CLDLm.

The stages STGL1 to STGLm receive control signal and voltages CTRLS1. The control signal and voltages CTRLS1 inputted to the stages STGL1 to STGLm include the vertical start signal STV from the timing controller 120 of FIG. 1, the clock signals CLK1 and CLK2 from the timing controller 120, the common reference voltage VDC from the voltage generator 160 of FIG. 1, and the first and second common voltages VBA and VBB from the voltage generator 160. In response to the control signal and voltages CTRLS1, the stages STGL1 to STGLm drive the first gate lines GL1 to GLm and output the first line enable signals LEL1 to LELm, respectively.

The common voltage driving units CLDL1 to CLDLm correspond to the stages STGL1 to STGLm, respectively. In response to the first line enable signals LEL1 to LELm, the common voltage driving units CLDL1 to CLDLm drive the first common voltage lines CL1 to CLm, respectively.

The first line enable signal LELi−1 outputted from the i−1st stage STGLi−1 is provided to the i-th stage STGLi. The first stage STGL1 receives the vertical start signal STV from the timing controller 120, instead of the line enable signal.

Figure 4:
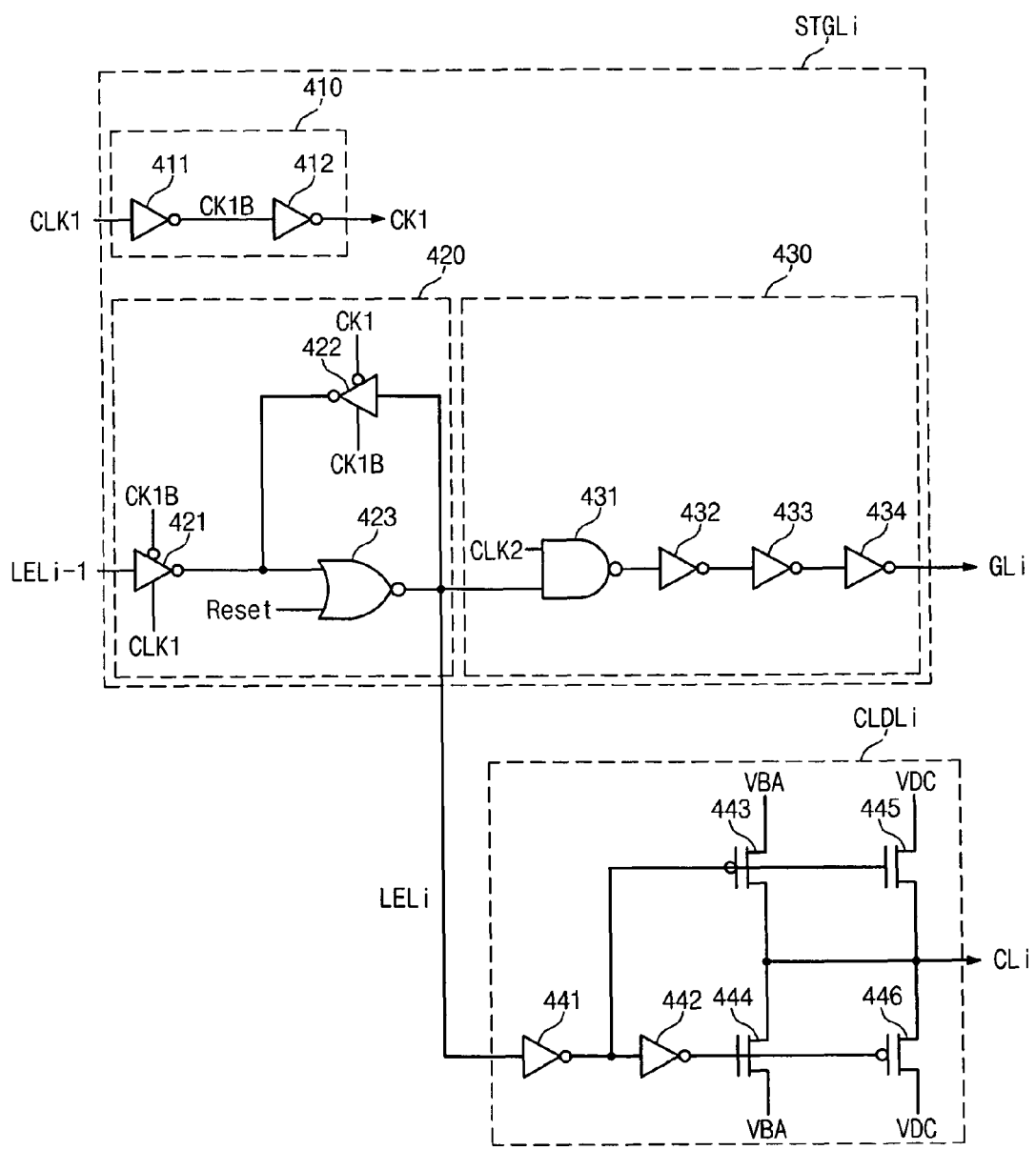
FIG. 4 illustrates a circuit diagram exemplarily illustrating detailed circuit configurations of the i-th stage and common voltage driving unit of FIG. 3.

FIG. 4 is a circuit diagram illustrating exemplary detailed circuit configurations of the i-th stage and common voltage driving unit of FIG. 3.

Referring to FIG. 4, the stage STGLi includes a clock generator 410, a latch circuit 420, and an output circuit 430. The clock generator 410 receives the first clock signal CLK1 to output clock signals CK1B and CK1. The clock generator 410 includes serially-connected inverters 411 and 412. The inverter 411 receives the first clock signal CLK1 to output the clock signal CK1B. The inverter 412 receives the clock signal CK1B to output the clock signal CK1.

The latch circuit 420 includes switching devices 421 and 422, and a NOR gate 423. The switching device 421 has an input terminal receiving the first line enable signal LELi−1 from a previous stage, i.e., the i−1st stage STGLi−1, and an output terminal. When the clock signal CK1B has a low level and the clock signal CK1 has a high level, the switching device 421 inverts the first line enable signal LELi−1 and outputs the inverted signal through the output terminal. The NOR gate 423 has one input terminal connected to the output terminal of the switching device 421, another input terminal receiving a reset signal Reset, and an output terminal for outputting the first line enable signal LELi−1. When the clock signal CK1 has a low level and the clock signal CK1B has a high level, the switching device 422 outputs the first line enable signal LELi−1 to the input terminal of the NOR gate 423. The first line enable signal LELi−1 outputted from the latch circuit 420 is inputted to the output circuit 430 and the common voltage driving unit CLDLi.

The output circuit 430 includes a NAND gate 431, and inverters 432 to 434. The NAND gate 431 receives the clock signal CLK2 and the first line enable signal LELi−1. The inverters 432 to 434 are serially and sequentially connected between the output terminal of the NAND gate 431 and the first gate line GLi.

The common voltage driving unit CLDLi includes inverters 441 and 442, PMOS transistors 443 and 446, and NMOS transistors 444 and 445. The inverter 441 receives and inverts the first line enable signal LELi−1. The inverter 442 receives and inverts a signal that is outputted from the inverter 441. The PMOS transistor 443 is connected between the first common voltage VBA and the first common voltage line CLi, and has a gate that is controlled by the output signal of the inverter 441. The NMOS transistor 444 is connected between the first common voltage VBA and the first common voltage line CLi, and has a gate that is controlled by the output signal of the inverter 442. The NMOS transistor 445 is connected between the common reference voltage VDC and the first common voltage line CLi, and has a gate that is controlled by the output signal of the inverter 441. The PMOS transistor 446 is connected between the common reference voltage VDC and the first common voltage line CLi, and has a gate that is controlled by the output signal of the inverter 442.

The operations of the stage STGLi and common voltage driving unit CLDLi respectively having such configurations are as follows. While the clock signal CK1B has a low level and the clock signal CK1 has a high level, the first line enable signal LELi−1 outputted from the previous stage STGLi−1 is inputted to the NOR gate 423. When the first line enable signal LELi−1 has a high level and the reset signal Reset has a low level, the latch circuit 420 outputs the first line enable signal LELi−1 having a high level. As the first line enable signal LELi−1 is shifted to a high level, the inverter 441 outputs a low-level signal, and the inverter 442 outputs a high-level signal. Therefore, the PMOS transistor 443 and the NMOS transistor 444 are turned on, and the first common voltage line CLi is driven to the first common voltage VBA.

When the first line enable signal LELi−1 has a high level and the clock signal CLK2 has a high level, a delay time due to the NAND gate 431 and the inverters 432 to 434 elapses. Thereafter, the first gate line GLi is driven to a high level. Therefore, as the first line enable signal LELi−1 is activated to a high level, the first common voltage line CLi may be driven first, and then the first gate line GLi may be driven.

When the first line enable signal LELi−1 outputted from the previous stage STGLi−1 is shifted to a low level, the latch circuit 422 outputs the first line enable signal LELi−1 having a low level. As the first line enable signal LELi−1 is shifted to a low level, the PMOS transistor 443 and NMOS transistor 434 of the common voltage driving unit CLDLi are turned off, and the NMOS transistor 445 and the PMOS transistor 446 are turned on. Therefore, the first common voltage line CLi is driven to the common reference voltage CVD. In response to the first line enable signal LELi−1, the output circuit 430 drives the first gate line GLi to a low level.

The common voltage driving unit CLDLi having such a simple circuit configuration may drive the first common voltage line CLi.

Figure 5:
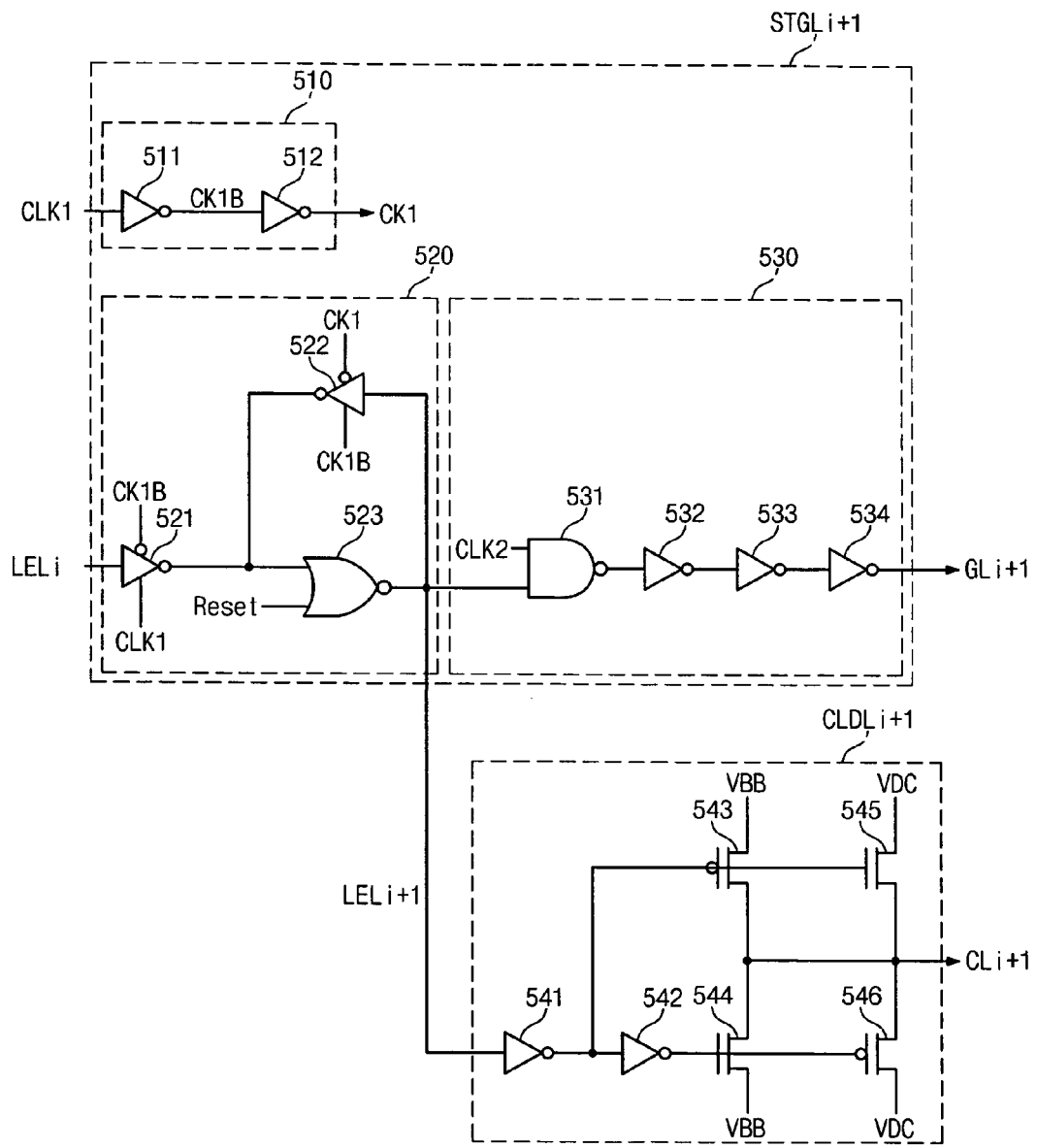
FIG. 5 illustrates a circuit diagram exemplarily illustrating detailed circuit configurations of the (i+1)-th stage and common voltage driving unit of FIG. 3.

FIG. 5 is a circuit diagram exemplarily illustrating detailed circuit configurations of the (i+1)-th stage and common voltage driving unit of FIG. 3.

Referring to FIG. 5, the i+1th stage STGLi+1 has the same configuration as that of the i+1th stage STGLi+1 of FIG. 4. The common voltage driving unit CLDLi+1 has the same configuration as that of the common voltage driving unit CLDLi of FIG. 4. Unlike FIG. 4, a PMOS transistor 543 and NMOS transistor 544 of the common voltage driving unit CLDLi+1 receive the second common voltage VBB instead of the first common voltage VBA.

Figure 6:
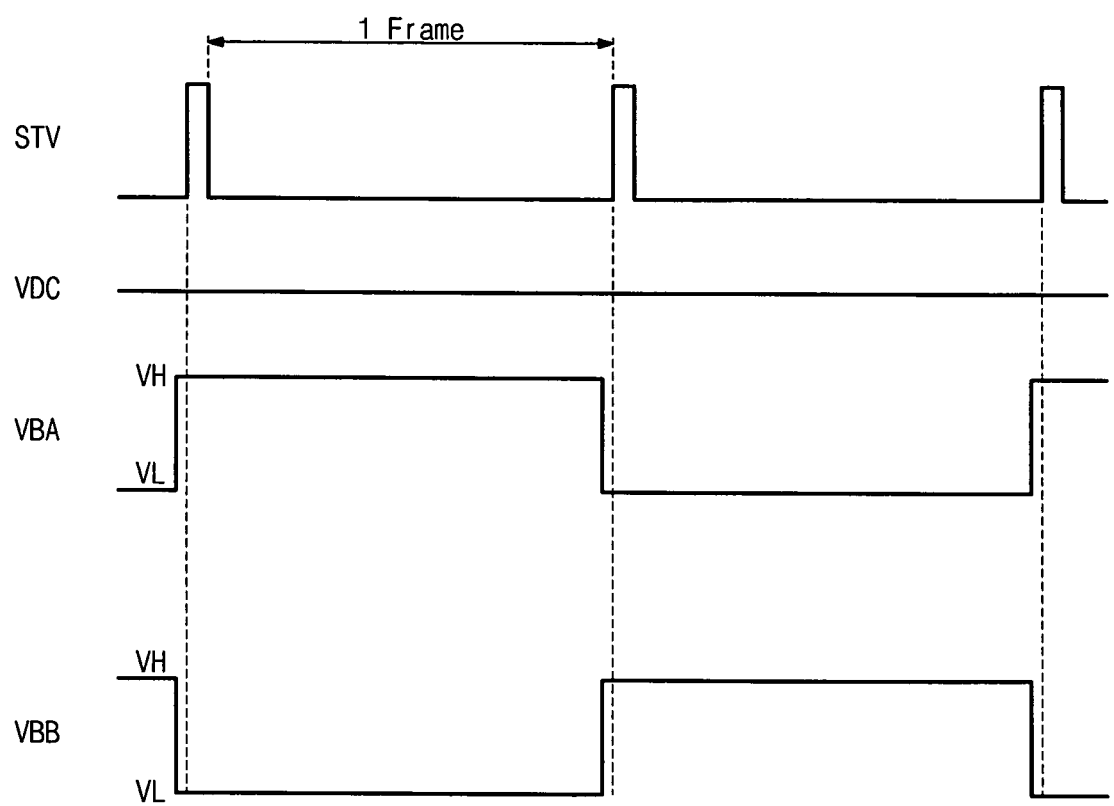
FIG. 6 illustrates a timing diagram showing the level change of a common reference voltage and first and second common voltages which are used in common voltage driving units of FIGS. 4 and 5.
Figures 7, 8:
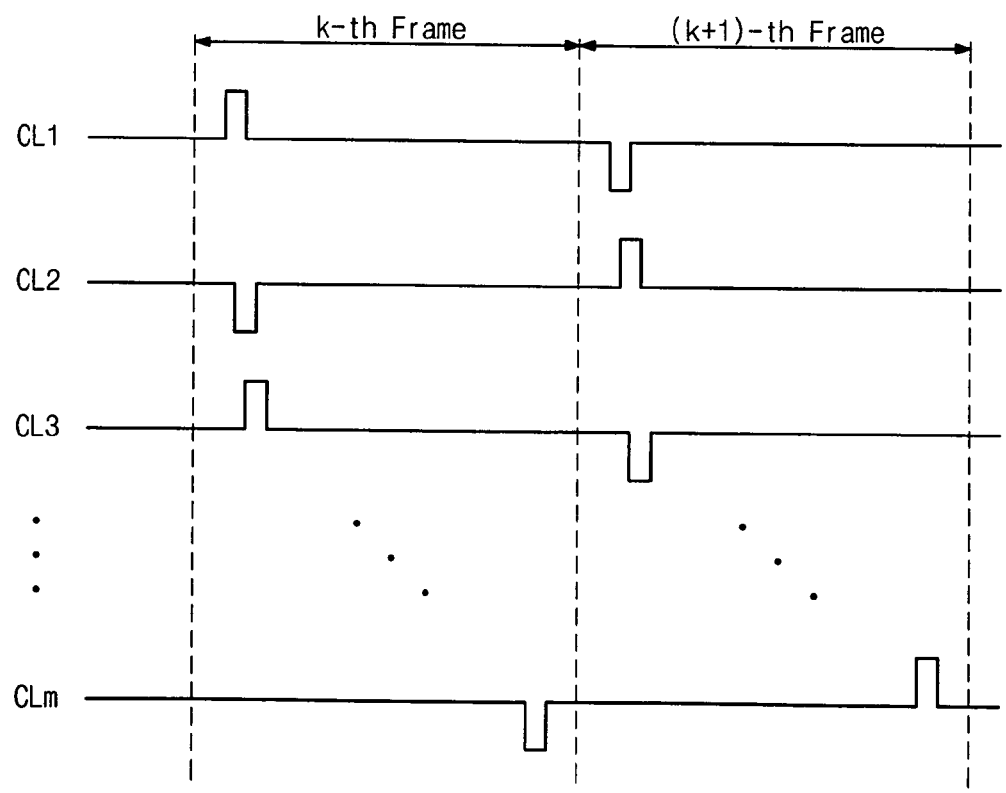
FIG. 7 illustrates a diagram conceptually illustrating the line inversion driving of a liquid crystal panel with common voltage drivers of FIG. 1.
FIG. 8 illustrates a timing diagram showing the voltage level change of common voltage lines.

FIG. 6 is a timing diagram showing the level change of the common reference voltage and first and second common voltages which are used in the common voltage driving units of FIGS. 4 and 5. FIG. 7 is a diagram conceptually illustrating the line inversion driving of the liquid crystal panel with the common voltage drivers 150a and 150b of FIG. 1.

Referring to FIG. 6, the common reference voltage VDC maintains a certain voltage level. The first common voltage VBA is alternately inverted into a first level VH and a second level VL per frame. The second common voltage VBA is alternately inverted into the second level VL and the first level VH per frame, and has a complementary relationship with the first common voltage VBA.

Therefore, when the common voltage driving unit CLDLi of FIG. 4 drives the first common voltage line CLi to the first level VH in a certain frame, the common voltage driving units CLDLi+1 of FIG. 4 may drive the first common voltage line CLi+1 to the second level VL.

FIG. 8 is a timing diagram showing the voltage level change of the common voltage lines CL1 to CLi.

Referring to FIG. 8, the first common voltage lines CL1 to CLm are sequentially driven. In a kth frame, the odd-numbered first common voltage lines CL1, CL3, . . . , CLm−1 are driven to the first common voltage VBA, and the even-numbered first common voltage lines CL2, CL4, . . . , CLm are driven to the second common voltage VBB. In a k+1st frame, the odd-numbered first common voltage lines CL1, CL3, . . . , CLm−1 are driven to the second common voltage VBB, and the even-numbered first common voltage lines CL2, CL4, . . . , CLm are driven to the first common voltage VBA.

Intervals, in which two adjacent first common voltage lines, i.e., the i-th first common voltage line CLi and the (i+1)-th first common voltage line CLi+1 are driven to the first common voltage VBA or the second common voltage VBB, overlap partially.

Figure 9:
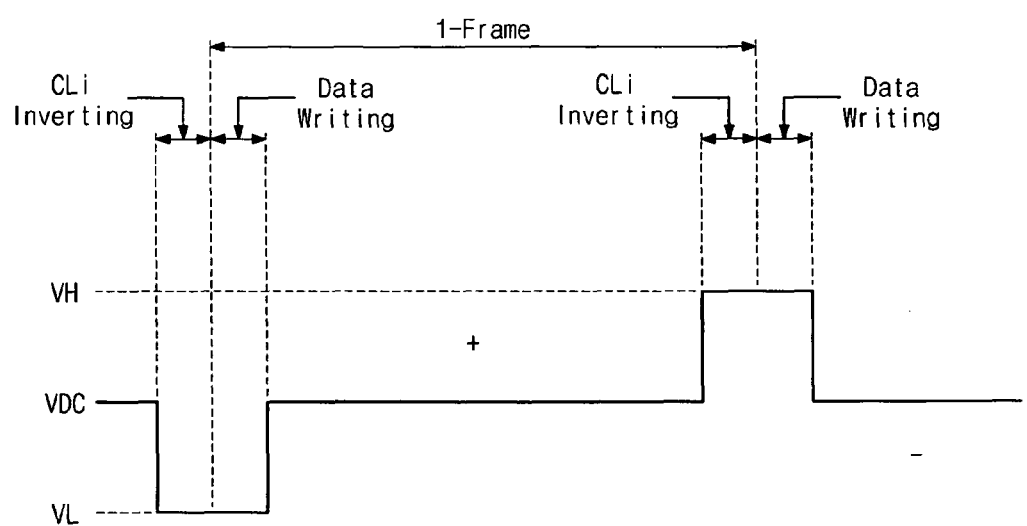
FIG. 9 illustrates a diagram conceptually showing the potential of a pixel and the provision timing of a data signal provided to the pixel, according to the driving voltage level of a common voltage line.

FIG. 9 is a diagram conceptually showing the potential of a pixel and the provision timing of a data signal provided to the pixel, according to the driving voltage level of a common voltage line.

Referring to FIG. 9, the i-th first common voltage line CLi is driven from the common reference voltage level VDC to the second level VL, i.e., the second common voltage VBB, and thereafter a data signal is applied to pixels connected to the i-th first gate line GLi through the source lines S1 to Sk−1. At this point, the pixels connected to the first gate line GLi is driven to a positive polarity (+). In a next frame, the i-th first common voltage line CLi is driven from the common reference voltage level VDC to the first level VH, i.e., the first common voltage VBA, and thereafter a data signal is applied to pixels connected to the i-th first gate line GLi through the source lines S1 to Sk−1. At this point, the pixels connected to the first gate line GLi is driven to a negative polarity (−).

While the first common voltage line CLi is being driven from the common reference voltage level VDC to the second level VL, a data signal is applied to pixels the i−1st first gate line GLi−1.

Figure 10:
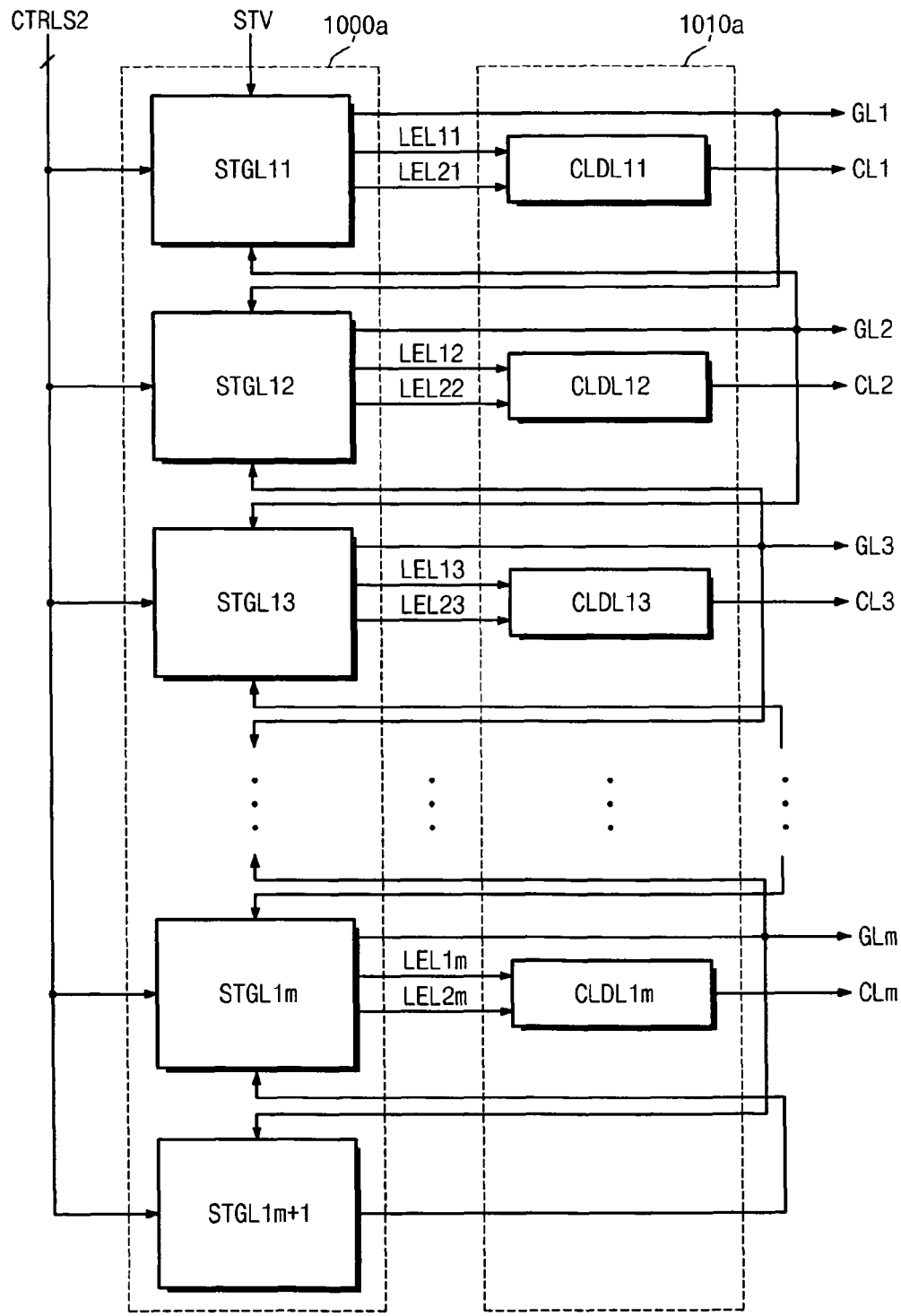
FIG. 10 illustrates a block diagram illustrating detail configurations of the gate driver and common voltage driver of FIG. 1, according to another embodiment.

FIG. 10 is a block diagram illustrating detail configurations of the gate driver and common voltage driver of FIG. 1, according to another embodiment.

FIG. 10 illustrates only a first gate driver 1000a and a first common voltage driver 1010b for left pixels. However, a second gate driver for right pixels has the same configuration as that of the first gate driver 1000a and operates similarly to the first gate driver 1000a. A second common voltage driver for right pixels has the same configuration as that of the first common voltage driver 1010a and operates similarly to the first common voltage driver 1010a.

Referring to FIG. 10, the gate driver 1000a includes a plurality of stages STGL11 to STGL1m+1, and the first common voltage driver 1010a includes a plurality of common voltage driving units CLDL11 to CLDL1m.

The stages STGL11 to STGL1m receive control signal and voltages CTRLS2. The control signal and voltages CTRLS2 inputted to the stages STGL11 to STGL1m include driving signals D1R and D1RB from the timing controller 120 of FIG. 1, the clock signals CLK1 and CLK2 from the timing controller 120, the vertical start signal STV from the timing controller 120, the common reference voltage VDC from the voltage generator 160 of FIG. 1, the first and second common voltages VBA and VBB from the voltage generator 160, and first and second bias voltages VGH and VGL from the voltage generator 160. The stages STGL11 to STGL1m receive the vertical start signal STV. In response to the control signal and voltages CTRLS2, the stages STGL11 to STGL1m drive the first gate lines GL1 to GLm and output third and fourth line enable signals LEL11 to LEL1m and LEL21 to LEL2m, respectively.

The common voltage driving units CLDL11 to CLDL1m correspond to the stages STGL11 to STGL1m, respectively. In response to the third and fourth line enable signals LEL11 to LEL1m and LEL21 to LEL2m, the common voltage driving units CLDL11 to CLDL1m drive the first common voltage lines CL1 to CLm, respectively.

Figure 11:
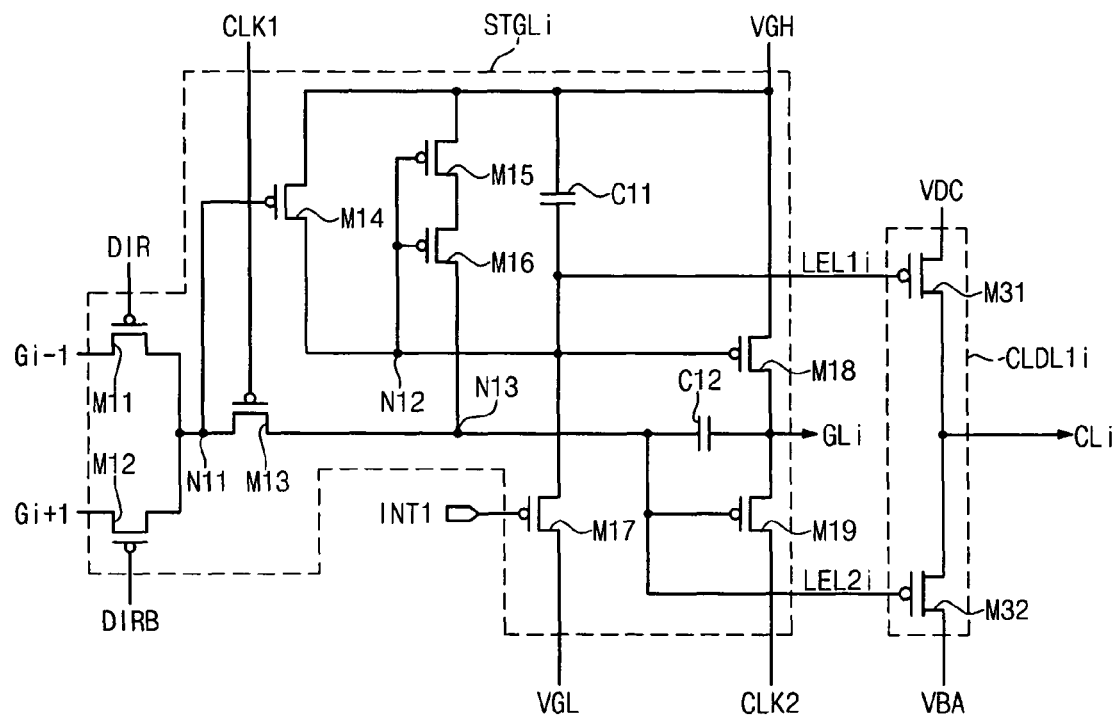
FIG. 11 illustrates a circuit diagram exemplarily illustrating configurations of the stage and common voltage driving unit of FIG. 10.

FIG. 11 is a circuit diagram illustrating exemplarily configurations of the stage and common voltage driving unit of FIG. 10.

Referring to FIG. 11, the stage STGL1i includes a plurality of PMOS transistors M11 to M19, and a plurality of capacitors C11 and C12. The PMOS transistor M11 is connected between a first node N11 and an output of the previous stage STGL1i−1, i.e., the first gate line GLi−1, and has a gate controlled by the driving signal D1R. The PMOS transistor M12 is connected between the first node N11 and an output of the next stage STGL1i+1, i.e., the first gate line GLi+1, and has a gate controlled by the driving signal D1RB. The PMOS transistor M13 is connected between the first node N11 and a third node N13, and has a gate controlled by the clock signal CLK1. The PMOS transistor M14 is connected between the operation voltage VGH and a second node N12, and has a gate controlled by the signal of the first node N11. PMOS transistors M15 and M16 are serially and sequentially connected between the first bias voltage VGH and the third node N13, and has a gate controlled by the signal of the second node N12. The capacitor C11 is connected between the first bias voltage VGH and the second node N12. The PMOS transistor MI7 is connected between the second node N12 and the second bias voltage VGL, and has a gate controlled by an initialization signal INT1. The PMOS transistor M18 is connected between the first bias voltage VGH and the first gate line GLi, and has a gate controlled by the signal of the second node N12. The PMOS transistor M19 is connected between the clock signal CLK2 and the first gate line GLi, and has a gate controlled by the signal of the third node N13.

The common voltage driving unit CLDL1$i$ includes PMOS transistors M31 and M32. The PMOS transistor M31 is connected between the common reference voltage VDC and the first common voltage line CLi, and has a gate controlled by the third line enable signal LEL11. The PMOS transistor M32 is connected between the first common voltage VBA and the first common voltage line CLi, and has a gate controlled by the fourth line enable signal LEL2$i$.

Figure 12:
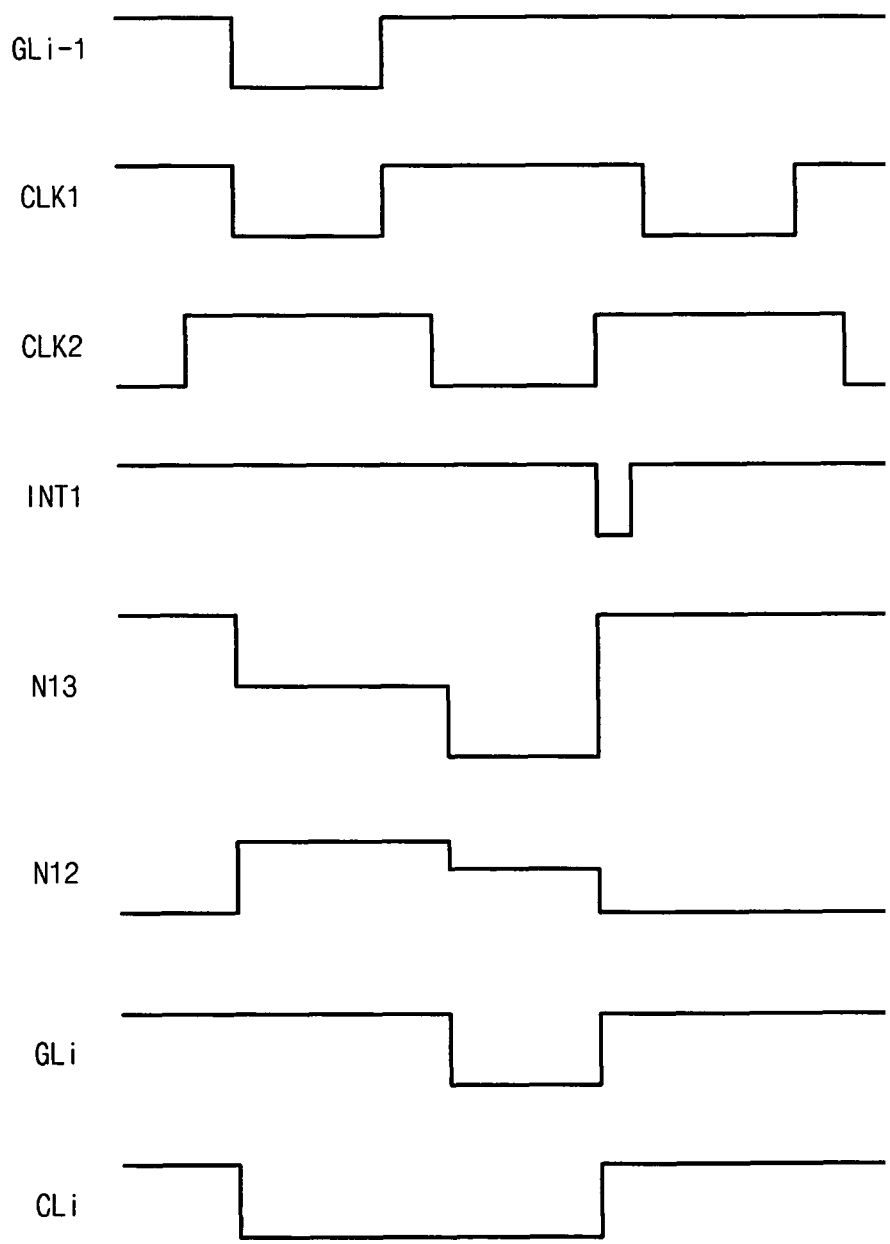
FIG. 12 illustrates a timing diagram of signals which are used in the stage and common voltage driving unit of FIG. 11.

FIG. 12 is a timing diagram of signals which are used in the stage and common voltage driving unit of FIG. 11.

Referring to FIGS. 11 and 12, while the first driving signal D1R has a low level, the first node N11 has a low level when the first gate line GLi−1 has a low level. At this point, when the clock signal CLK1 has a low level, the PMOS transistor M13 is turned on, and thus the third node N13 is driven to a low level. As the fourth line enable signal LEL2$i$ of the third node N13 is shifted to a low level, the PMOS transistor M32 of the common voltage driving unit CLDL1$i$ is turned on, and the common voltage driving unit CLDL1$i$ is driven to the first common voltage VBA. Furthermore, since the fourth line enable signal LEL2$i$ of the third node N13 has a low level, the PMOS transistor M19 is turned on, and thus the first gate line GLi is driven to a high level identical to the clock signal CLK2. Since the third node N13 is maintained at a low level by the capacitor C12, the first gate line GLi is driven to a low level when the clock signal CLK2 is shifted from a high level to a low level.

As the initialization signal INT1 is shifted from a high level to a low level, the second node N12 is shifted to a low level. When the second node N12 is shifted to a low level, the PMOS transistors M15 and M16 are turned on. Thus, the third node N13 is shifted to a high level. Therefore, the first gate line GLi is driven to a high level. As the second node N12 is shifted to a low level, the PMOS transistor M31 of the common voltage driving unit CLDL1$i$ is turned on, and the first common voltage line CLi is driven to the common reference voltage VDC.

The common voltage driving unit CLDL1$i$ of FIG. 11 may drive the first common voltage line CLi using only the third and fourth line enable signals LEL11 to LEL1$m$ and LEL21 to LEL2$m$ and the two PMOS transistors M31 and M32.

The (i+1)-th stage STGLi+1 of FIG. 10 has the same configuration as that of the i-th stage STGL1$i$ of FIG. 11. The common voltage driving unit CLDL1$i$+1 of FIG. 10 has the same configuration as that of the common voltage driving unit CLDL1$i$ of FIG. 11. Unlike the common voltage driving unit CLDL1$i$, however, the common voltage driving unit CLDL1$i$+1 receives the second common voltage VBB instead of the first common voltage VBA.

Embodiments may be directed to a display device which has a simple circuit configuration and operates in the inversion mode. More particularly, as a circuit area decreases, the area of the black matrix may also be reduced.

Example embodiments have been disclosed herein, and although specific terms are employed, they are used and are to be interpreted in a generic and descriptive sense only and not for purpose of limitation.

What is claimed is:
1. A display device, comprising:
a plurality of pixels of a first group and a plurality of pixels of a second group, wherein the plurality of pixels of the first group are connected to a plurality of first gate lines and first common voltage lines through which a common voltage of the pixels of the first group is supplied, and the plurality of pixels of the second group are connected to a plurality of second gate lines and second common voltage lines through which a common voltage of the pixels of the second group is supplied;
a first gate driver driving the plurality of first gate lines with a plurality of first gate driving signals, and outputting a plurality of first line enable signals which respectively correspond to the plurality of first common voltage lines;
a first common voltage driver receiving the plurality of first line enable signals and driving the first common voltage lines in response to the plurality of first line enable signals;
a second gate driver driving the plurality of second gate lines with a plurality of second gate driving signals, and outputting a plurality of second line enable signals which respectively correspond to second common voltage lines; and
a second common voltage driver receiving the plurality of second line enable signals and driving the second common voltage lines in response to the plurality of second line enable signals,
wherein driving the first common voltage lines is performed inversely by the first common voltage driver per frame, driving the second common voltage lines is performed inversely by the second common voltage driver per frame, and driving the first common voltage lines and the second common voltage lines are performed inversely, respectively, prior to driving corresponding first and second gate lines of the plurality of first and second gate lines with corresponding first and second gate driving signals of the plurality of first and second gate driving signals, respectively.

2. The display device as claimed in claim 1, wherein the first gate driver includes a plurality of stages, and each stage of the plurality of stages drives the corresponding first gate line of the plurality of first gate lines, and outputs a corresponding first line enable signal of the plurality of first line enable signals.

3. The display device as claimed in claim 2, wherein each stage of the plurality of stages includes:
a latch circuit latching a previous first line enable signal from a previous stage to output the corresponding first line enable signal, in response to a first clock signal; and
an output circuit driving the corresponding first gate line of the plurality of first gate lines according to the corresponding first line enable signal, in response to a second clock signal.

4. The display device as claimed in claim 3, wherein the latch circuit includes:
a clock generator that, upon receiving the first clock signal, generates a first sub clock signal and a second sub clock signal;
a first switching device including an input terminal to receive the previous first line enable signal and an output terminal, and operating in response to the first clock signal and the first sub clock signal;
a NOR gate that, upon receiving a signal of the output terminal of the first switching device and a reset signal, outputs the corresponding first line enable signal; and
a second switching device connected between the corresponding first line enable signal and the output terminal of the first switching device, and operating in response to the first and the second sub clock signal.

5. The display device as claimed in claim 4, wherein the output circuit includes:

a logic circuit receiving the second clock signal and the corresponding first line enable signal; and a plurality of inverters serially and sequentially connected between an output terminal of the logic circuit and the corresponding first gate line of the plurality of first gate lines.

6. The display device as claimed in claim 3, wherein the first common voltage driver includes a plurality of first common voltage units, and each first common voltage unit of the plurality of common voltage units drives a corresponding first common voltage line to one selected between a first common voltage and a common reference voltage in response to the corresponding first line enable signal.

7. The display device as claimed in claim 6, wherein each first common voltage unit of the plurality of common voltage units includes:

a first inverter including an input terminal for receiving the corresponding first line enable signal, and an output terminal;

a second inverter including an input terminal connected to the output terminal of the first inverter, and an output terminal;

a first transistor connected between the first common voltage and the corresponding first common voltage line, and including a gate connected to the output terminal of the first inverter;

a second transistor connected between the first common voltage and the corresponding first common voltage line, and including a gate connected to the output terminal of the second inverter;

a third transistor connected between the common reference voltage and the corresponding first common voltage line, and including a gate connected to the output terminal of the first inverter; and a fourth transistor connected between the common reference voltage and the corresponding first common voltage line, and including a gate connected to the output terminal of the second inverter.

8. The display device as claimed in claim 6, wherein the second common voltage driver includes a plurality of second common voltage units, and each second common voltage unit of the plurality of common voltage units drives a corresponding second common voltage line of the second common voltage lines to one selected between a second common voltage and the common reference voltage in response to the corresponding second line enable signal.

9. The display device as claimed in claim 8, wherein the first common voltages and the second common voltages have complementary voltage levels, and are inverted per frame.

10. The display device as claimed in claim 8, wherein:

an i-th first common voltage line (where i is a positive integer) is driven to the first common voltage, an (i+1)-th first common voltage line is driven to the second common voltage, and an interval in which the i-th first common voltage line is driven to the first common voltage partially overlaps with an interval in which the (i+1)-th first common voltage line is driven to the second common voltage.

11. The display device as claimed in claim 1, wherein the first gate driver includes a plurality of stages, and each stage of the plurality of stages drives the corresponding first gate line of the plurality of first gate lines, and outputs at least two corresponding first line enable signals corresponding to the corresponding first common voltage line of the plurality of first common voltage lines.

12. The display device as claimed in claim 11, wherein each stage of the plurality of stages includes:

a first transistor connected between a gate line corresponding to a previous stage and a first node, and including a gate controlled by a first driving signal;

a second transistor connected between a gate line corresponding to a next stage and the first node, and including a gate controlled by a second driving signal;

a third transistor connected between the first node and a third node, and including a gate controlled by a first clock signal;

a fourth transistor connected between a first bias voltage and a second node, and including a gate connected to the first node;

a fifth transistor and a sixth transistor, serially and sequentially connected between the first bias voltage and the third node, and including a gate connected to the second node;

a first capacitor connected between the first bias voltage and the second node;

a seventh transistor connected between a second bias voltage and the second node, and including a gate controlled by an initialization signal;

an eighth transistor connected between the first bias voltage and the corresponding first gate line, and including a gate connected to the second node;

a second capacitor connected between the third node and the corresponding first gate line; and a ninth transistor connected between a second clock signal and the corresponding first gate line, and including a gate connected to the third node.

13. The display device as claimed in claim 12, wherein the first common voltage driver includes a plurality of first common voltage units, and each first common voltage unit of the plurality of common voltage units includes:

a tenth transistor connected between a common reference voltage and the corresponding first common voltage line, and including a gate connected to the second node; and an eleventh transistor connected between a first common voltage and the corresponding first common voltage line, and including a gate connected to the third node.

14. A driving method of a display device including a plurality of pixels of a first group connected to a plurality of first gate lines and first common voltage lines through which a common voltage of the pixels of the first group is supplied, a plurality of pixels of a second group connected to a plurality of second gate lines and second common voltage lines through which a common voltage of the pixels of the second group is supplied, a first gate driver driving the plurality of first gate lines and generating a plurality of first line enable signals corresponding to the plurality of first common voltage lines, a second gate driver driving the plurality of second gate lines and generating a plurality of second line enable signals corresponding to the plurality of second common voltage lines, a first common voltage driver receiving the plurality of first line enable signals and driving the plurality of first common voltage lines in response to the plurality of first line enable signals, and a second common voltage driver receiving the plurality of second line enable signals and driving the plurality of second common voltage lines in response to the plurality of second line enable signals, the driving method comprising:

driving the first common voltage lines and the second common voltage lines in synchronization with a first clock signal; and driving the plurality of first gate lines and the plurality of second gate lines in synchronization with a second clock signal, wherein:
an i-th first common voltage line of the plurality first common voltage lines and an i-th second common voltage line of the plurality second common voltage lines (where i is a positive integer) are driven to one selected between a first common voltage and a common reference voltage according to an i-th first line enable signal of the plurality of first line enable signals and an i-th second line enable signal of the plurality of second line enable signals, respectively,
a (i+1)-th first common voltage line of the plurality first common voltage lines and a (i+1) second common voltage line of the plurality second common voltage lines are driven to one selected between a second common voltage and the common reference voltage according to a (i+1)-th first line enable signal of the plurality of first line enable signals and a (i+1)-th second line enable signal of the plurality of second line enable signals, respectively, and
the first common voltage and the second common voltage have complementary voltage levels each other, and are inverted per frame.

15. The driving method as claimed in claim 14, wherein an interval in which the i-th first common voltage line is driven to the first common voltage partially overlaps with an interval in which the (i+1)-th first common voltage line is driven to the second common voltage.

16. A driving method of a display device, which includes a plurality of pixels of a first group connected to a plurality of first gate lines and a plurality of first common voltage lines through which a common voltage of the pixels of the first group is supplied, a plurality of pixels of a second group connected to a plurality of second gate lines and a plurality of second common voltage lines through which a common voltage of the pixels of the second group is supplied, a plurality of stages respectively included in first and second gate drivers corresponding to first gate lines of the plurality of first gate lines and second gate lines of the plurality of second gate lines, and a plurality of common voltage driving units respectively included in first and second common voltage drivers corresponding to the first common voltage lines and the second common voltage lines, the driving method comprising:
outputting, by each state of the plurality of stages respectively included in the first and second gate drivers, a line enable signal in response to a previous line enable signal from a previous stage;
driving, by each common voltage driving unit of the plurality of common voltage driving units respectively included in the first and second common voltage drivers, a corresponding common voltage line in response to the line enable signal; and
driving, by each stage of the plurality of stages, a corresponding gate line in response to the line enable signal and a second clock signal, wherein
driving voltages corresponding to the first common voltage lines and the second common voltage lines are inverted per frame.

17. The driving method as claimed in claim 16, wherein:
an i-th first common voltage line of the plurality first common voltage lines and an i-th second common voltage line of the plurality second common voltage lines (where i is a positive integer) are driven to one selected between a first common voltage and a common reference voltage according to an i-th line enable signal, and
a (i+1)-th first common voltage line of the plurality first common voltage lines and a (i+1)-th second common voltage line of the plurality second common voltage lines are driven to one selected between a second common voltage and the common reference voltage according to an (i+1)-th line enable signal.

18. The driving method as claimed in claim 17, wherein when the line enable signal is activated to a first level,
the i-th first common voltage lines and the i-th second common voltage lines are driven to the first common voltage, and
the (i+1)-th first common voltage lines and the (i+1)-th second common voltage lines is driven to the second common voltage.

19. The driving method as claimed in claim 18, wherein when the line enable signal is deactivated to a second level,
the i-th first common voltage lines and the i-th second common voltage lines are driven to the common reference voltage, and
the (i+1)-th first common voltage lines and the (i+1)-th second common voltage lines is driven to the common reference voltage.

20. The driving method as claimed in claim 19, wherein the first common voltages and the second common voltages have complementary voltage levels, and are inverted per frame.

* * * * *